United States Patent [19]

Hang et al.

[11] Patent Number: 4,788,163

[45] Date of Patent: Nov. 29, 1988

[54] DEVITRIFYING GLASS FRITS

[75] Inventors: Kenneth W. Hang; Ashok N. Prabhu, both of Windsor Township, Mercer County, N.J.

[73] Assignee: General Electric Company, Schenectady, N.Y.

[21] Appl. No.: 87,547

[22] Filed: Aug. 20, 1987

[51] Int. Cl.[4] .................. C03C 8/14; C03C 8/04
[52] U.S. Cl. ........................ 501/17; 501/5; 501/10; 501/18; 501/26
[58] Field of Search ............ 501/18, 26, 17, 5, 10

[56] References Cited

U.S. PATENT DOCUMENTS

| | | | |
|---|---|---|---|
| 3,022,179 | 2/1962 | Morrissey | 501/2 |
| 3,501,322 | 3/1970 | Dumbaugh, Jr. et al. | 501/21 |
| 3,876,407 | 4/1975 | Hirose et al. | 65/30.13 |
| 3,957,496 | 5/1976 | Eagan | 501/2 |
| 4,049,872 | 9/1977 | Hang | 428/427 |
| 4,061,584 | 12/1977 | Girard et al. | 501/32 |
| 4,256,796 | 3/1981 | Hang et al. | 428/210 |
| 4,355,114 | 10/1982 | Hang et al. | 501/5 |
| 4,355,115 | 10/1982 | Hang et al. | 501/21 |
| 4,369,220 | 1/1983 | Prabhu et al. | 428/209 |
| 4,369,254 | 1/1983 | Prabhu et al. | 501/21 |
| 4,376,725 | 3/1983 | Prabhu et al. | 252/512 |
| 4,377,642 | 3/1983 | Prabhu et al. | 501/20 |
| 4,385,127 | 5/1983 | Chyung | 501/5 |
| 4,399,320 | 8/1983 | Prabhu et al. | 174/68.5 |
| 4,400,214 | 8/1983 | Ogawa et al. | 252/512 |
| 4,401,709 | 8/1983 | Prabhu et al. | 428/209 |
| 4,415,624 | 11/1983 | Prabhu et al. | 428/209 |
| 4,514,321 | 4/1985 | Siuta | 252/512 |
| 4,521,329 | 6/1985 | Siuta et al. | 252/512 |
| 4,536,535 | 8/1985 | Usala | 524/403 |
| 4,540,604 | 9/1985 | Siuta | 252/512 |
| 4,619,836 | 10/1986 | Prabhu et al. | 427/41 |
| 4,623,482 | 11/1986 | Kuo et al. | 252/512 |

FOREIGN PATENT DOCUMENTS

| | | |
|---|---|---|
| 0084936 | 8/1983 | European Pat. Off. . |
| 55-113641 | 9/1980 | Japan ................ 501/26 |
| 174544 | 10/1984 | Japan . |

Primary Examiner—William R. Dixon, Jr.
Assistant Examiner—Anthony J. Green
Attorney, Agent, or Firm—James Magee, Jr.; James C. Davis, Jr.

[57] ABSTRACT

A novel devitrifying frit is disclosed which has a coefficient of expansion essentially the same as that of silicon. The subject frits have a high softening temperature and excellent reheat stability which make them useful in ink formulations for forming dielectric layers in multilayer circuitry. The frits are also suitable for use as a substrate material for direct mounting of silicon chips or for use in thick film via-fill inks.

8 Claims, 1 Drawing Sheet

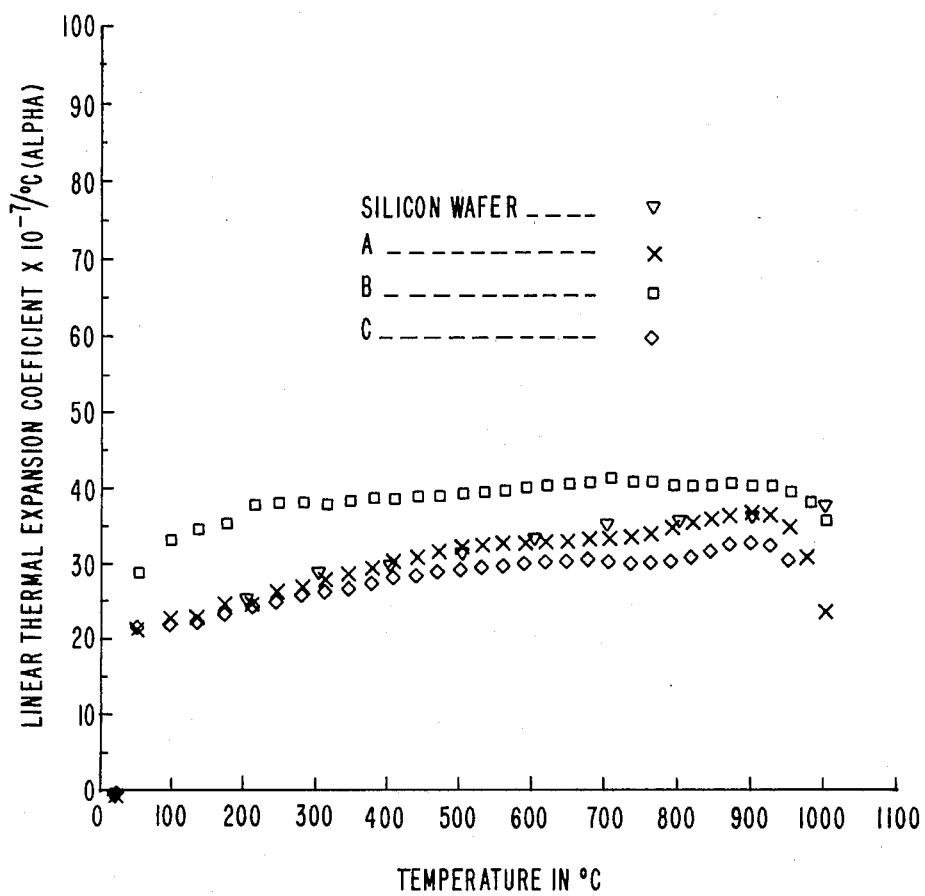

DEVITRIFYING GLASS FRITS

This invention relates to novel devitrifying glass frits which have coefficients of expansion very closely matched to silicon and which are suitable for use as a substrate material for direct mounting of very large silicon chips.

The Government has rights in this invention pursuant to Contract No. N00024-82-C-5110 awarded by the Department of the Navy.

BACKGROUND OF THE INVENTION

It is conventional in high density packaging to form circuits, subassemblies and the like on ceramic chip carriers and solder the chips to multilayer circuit board substrates. It is desirable to obtain the maximum density of circuitry on a substrate with the fewest number of processing steps. A means to accomplish this would be to utilize large chips. This approach has encountered a number of problems.

Attempts to solder large chips to conventional organic, e.g. epoxy-glass, polyimide-glass, circuit boards have not fared well due to the large temperature coefficient of expansion mismatch between the ceramic chip carriers and the substrate in the x-y direction. This produces solder joint fatigue damage during temperature and/or power cycling. Attempts to alleviate this problem, for example, by laminating circuit boards to a low expansion metal core, by using low expansion fillers in the laminates, by utilizing compliant coatings on the circuit boards and the like have not been successful for large area chip attachment.

Another approach to the problem has been the use of co-fired substates based on alumina ceramics. Such substrates require very high processing temperatures, i.e. 1400°-1550° C., and are therefore limited to refractory metals, such as tungsten or molybdenum, instead of significantly more conductive metals. Co-fired substrates based upon ceramic filled glass dielectrics do allow for lower processing tempeatures, but are limited to small size chips and frequently encounter interaction problems with conductor and resistor circuit materials applied between dielectric layers.

Thick film multilayer structures are advantageous in that they utilize highly conductive metallization. However, since the chips are not well matched to the substrate, they are extremely restricted in size when utilized for direct bonding.

In accordance with this invention, there is provided a devitrified glass which is suitable for use as a substrate material for the direct mounting of large silicon chips.

SUMMARY OF THE INVENTION

Devitrifying glass frits are provided which have a high flow temperature, i.e. from 800°-900° C., possess excellent reheat stability up to about 1000° C. and which have a coefficient of expansion essentially the same as that of silicon. These devitrifying glass frits can also be fabricated into fused bodies or a via-fill ink.

BRIEF DESCRIPTION OF THE DRAWING

FIG. 1 illustrates the linear thermal expansion coefficient data for a single-crystal silicon wafer and the devitrifying glass frits of this invention.

DETAILED DESCRIPTION OF THE PREFERRED EMBODIMENT

The devitrifying glass frit compositions of this invention are zinc-barium-aluminum-silicate glasses containing minor amounts of phosphorus pentoxide, zirconium silicate and a member of calcium oxide, magnesium oxide or mixtures thereof. The subject glass frit comprises, on a weight basis:

(a) from about 19 to about 25 percent of zinc oxide (ZnO);

(b) from about 5 to about 20 percent of barium oxide (BaO);

(c) from about 10 to about 30 percent of aluminum oxide ($Al_2O_3$);

(d) from about 30 to about 50 percent of silicon dioxide ($SiO_2$);

(e) from about 1 to about 6 percent of magnesium oxide (MgO), calcium oxide (CaO) or mixtures thereof;

(f) from about 0.5 to about 3 percent of phosphorus pentoxide ($P_2O_5$); and (g) from about 1 to about 6 percent of zirconium silicate ($ZrSiO_4$).

Preferred glass formulations in accordance with this invention contain, on a weight basis: from about 21 to about 23 percent of ZnO; from about 7 to about 15 percent of BaO; from about 13 to about 22 percent of $Al_2O_3$; from about 35 to about 45 percent of $SiO_2$ from about 2 to about 4.5 percent of MgO, CaO or mixtures thereof; from about 0.5 to about 1.5 percent of $P_2O_5$; and from about 2 to about 5 percent of $ZrSiO_4$.

The glass frits are prepared in a conventional manner by comminuting the various oxides and mixing them thoroughly in the desired proportion. The mixed oxides are melted in air at 1500°-1600° C. and then quenched, for example, between dry, counter-rotating ferrous metal rollers having a 0.01 inch gap. The resulting thin glass ribbon is easily milled to a fine powder. For most applications contemplated herein, the glass ribbon is milled to a mean particle size of about 3-5 micrometers.

The subject glass frits may be utilized in combination with a filler, particularly when a fused body or dielectric ink is being fabricated. Suitable filler materials are ceramic materials having high thermal conductivity, low expansion and low dielectric constants. It is necessary that the filler material have all of these properties. Suitable fillers include diamond powder, aluminum nitride, silicon carbide, silicon dioxide, a borosilicate glass and the like. The fused body comprises from about 65 to about 100, preferably from about 85 to about 95, percent by weight of the devitrifying glass frit and up to about 35, preferably from about 5 to about 15, percent by weight of a suitable filler. The fillers may be utilized individually or in mixtures of two or more in any proportion. The subject devitrifying glass frits are unique in that they will partially devitrify during firing and will therefore significantly add to the crystalline structure of the fired form. Hence, less filler is utilized than would be required with conventional glass frits. The subject glass frits behave as a glass during firing, but cool to a crystalline mass. For example, the firing of a mixture of 70 percent by weight of a glass frit according to this invention and 30 percent by weight of filler would cause approximately 60 percent by weight of the glass frit to crystallize, thus producing a final structure which is approximately 72 percent crystalline material and 28 percent of glass binder holding it in place. This is very advantageous since it provides a dielectric substrate having a potential reheat temperature higher than the temperature at which it was originally fired.

The devitrifying glass frits of this invention, with an appropriate amount of a suitable filler, may be fabricated directly into a fused body for use as a ceramic substrate by conventional processes such as injection molding or hot forging. The combination of frit and filler may be blended with a suitable organic binder, such as polyvinyl butyral and the like, and a suitable solvent, such as trichloroethylene, coated onto a suitable release surface, such as a polyethylene terephthalate film available from E. I. DuPont de Nemours & Co. under the trademark Mylar, and dried. The resulting dried layer is then separated and fired to form a sintered ceramic structure.

The devitrifying glass frit of the present invention may also be formulated into thick film dielectric inks for multilayer circuits. The frit is blended with a fillr material and an organic vehicle which is selected to give good screen printing characteristics and to burn off cleanly in nitrogen or air, i.e. without leaving a carbonaceous residue. The filler material may include the fillers used to fabricate the fused substrate or other conventional ceramic fillers suitable for use in a dielectric ink. The dielectric ink comprises from about 55 to about 80, preferably from about 60 to about 75, percent by weight of the devitrifying glass frit, up to about 30, preferably from about 5 to about 15, percent by weight filler and from about 15 to about 30, preferably from about 20 to about 25, percent by weight of a suitable organic vehicle.

The low thermal expansion devitrifying glass frits of the present invention may also be used as the glass material in a via-fill ink. Via-fill inks are used in multilayer circuit structures for filling vias in the thick film dielectric layers which conventionally separate the patterned conductor layers. The copper based via-fill ink would comprise from about 50 to about 70, preferably from about 50 to about 60, percent by weight of copper powder having a particle size of about 1 to about 5 microns. The ink would also comprise from about 15 to about 35, preferably from about 20 to about 32, percent by weight of the devitrifying glass frit along with about 5 to about 25, preferably from about 15 to about 20, percent by weight of an organic vehicle suitable for making the ink screen printable.

The organic vehicles for use with the dielectric and via-fill inks of the present invention are solutions of resin binders such as, for example, cellulose derivatives, particularly ethyl cellulose, synthetic resins such as polyacrylates, polymethacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2.4-trimethyl-1,3-pentanediol monoisobutyrate, available from Texas Eastman Company under the trademark Texanol and the like. The vehicles suitably contain from about 2 to about 25 percent by weight of the resin binder. The vehicles also suitably contain from about 0.5 to about 10, preferably from about 1 to about 3, percent by weight of a suitable surfactant such as oleylamine, available as Armeen O, a high molecular weight N-alkyl-1,3-diaminopropane dioleate, available as Duomeen TDO both from AKZO Chemie America, or a carboxylic acid salt surface active agent, available under the trademark Troysol 98C from Troy Chemical Corp.

The above resin binders may be utilized individually or in any combination of two or more. A suitable viscosity modifier can be added to the resin material if desired. Such a modifier can be, for example, a castor oil derivative available from NL Industries under the trademark Thixatrol. Regardless of the vehicle utilized, it is important that the homogeneity of the ink be maximized. Therefore, mixing is suitably carried out in a conventional apparatus which mixes in combination with subjecting the dispersion to high shearing action.

The dielectric inks can be utilized to form an insulating layer on a suitable substrate or to form patterned dielectric structures by conventional application such as screen printing, brushing, spraying and the like with screen printing being preferred. In forming either a thick substrate layer or a patterned dielectric, the desired structure is built up by several individually dried and fired applications, thereby minimizing the potential for through pin holes. The coating of ink is dried in air at 100°–125° C. for from 5 to 15 minutes and then fired in nitrogen at 850°–950° C. These firing temperatures are utilized regardless of whether the frits are formed into a free-standing substrate, a layer or a patterned dielectric.

The via-fill inks of this invention are also applied by conventional means, i.e., screen printing, brushing, spraying and the like, with screen printing being preferred. These via-fill inks are applied in an alternating sequence with the patterned layers of a suitable dielectric material, i.e., the dielectric ink is applied and fired before the via-fill ink is applied and fired to fill the vias formed in the patterned dielectric layer. The deposition and firing of both the dielectric and via-fill inks is repeated until the desired thickness of dielectric material between the conductor layers is achieved. In general, at least two layers of the dielectric/via-fill material having a total thickness of about 40 micrometers is required for sufficient dielectric separation between the patterned conductor layers. The patterned conductor layer is then applied over the dielectric/via-fill layer. The via-fill material provides an electrical connection between the adjacent conductor layers of the multilayer structure. The firing conditions which are used for the dielectric ink of this invention are also used for the via-fill inks.

The glass frits of this invention are advantageous in that their flow temperature is close to their fusion temperature. This means that they will remain porous in the furnace to temperatures in excess of 800° C. This provides substantial extra time in the furnace so that furnace gases may penetrate the frit and remove the last carbonaceous residues of an organic vehicle, if present. There is thus-produced a very dense ceramic structure. Due to this property, it is not necessary to include art-recognized oxygen-generating components, such as barium nitrate, in ink formulations containing the subject glass frits.

A significant advantage of the subject glass frits is that their coefficient of thermal expansion is almost exactly matched to silicon. Therefore, fused bodies prepared from the subject glass frits and a suitable filler are ideally suited as substrates for direct mounting of very large multi-pin VLSI (very large scale integrated circuit) silicon chips. The subject substates are further ideally suited as substrates for direct deposition of polycrystalline or epitaxial silicon in the fabrication of single or multilayer circuits. In addition to the other advantages mentioned above, the subject glass frits are advantageous in that they are suited to the fabrication of dielectric and via-fill inks useful in the production of multilevel circuitry. The subject substrates are further suitable for CVD growth of diamond films. Finally, structures formed from the subject inks have superior mechanical strength and excellent reheat stability due to the proximity of the glass softening temperature to the firing temperature.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Glasses were prepared by weighing the following components, mixing and melting at about 1600° in air in platinum containers. The melts were quenched with dry counter-rotating ferrous metal rollers having a 0.01 inch gap to form thin glass ribbons. The coefficient of expansion of each glass was determined using a fused silica dilatometer. The coefficient of expansion is given as alpha and is at 900°. The alpha numbers represent a value $\times 10^{-7}$ cm per cm per degree Celsius.

| Constituent | Glass Formulation (Percent) | | |
|---|---|---|---|
| | A | B | C |
| Zinc Oxide | 21.8 | 21.8 | 21.8 |
| Calcium Oxide | — | 3.9 | — |
| Magnesium Oxide | 4.0 | — | 2.6 |
| Barium Oxide | 7.8 | 11.7 | 14.7 |
| Silicon Dioxide | 41.7 | 36.8 | 42.1 |
| Aluminum Oxide | 20.7 | 20.3 | 14.8 |
| Phosphorus Pentoxide | 1.0 | 1.0 | 1.0 |
| Zirconium Silicate | 3.0 | 4.5 | 3.0 |
| Alpha (900°) | 37.1 | 40.9 | 33.4 |

FIG. 1 illustrates the linear expansion coefficients of fused glass bodies formed from formulations A, B and C. The fused glass bodies were formed by heating at 900° C. a mixture of the glass frit and isopropyl alcohol in a platinum container for about two hours. FIG. 1 also illustrates the expansion characteristics of a conventional single-crystal silicon wafer over the same temperature range as the glasses were tested. The data show that the thermal expansion properties of the glasses of the present invention are essentially the same as to that of the single-crystal silicon wafer.

EXAMPLE 2

Dielectric inks were prepared using glass formulations A, B and C of Example 1. The dielectric ink formulations are listed in the following table.

| Constituent | Dielectric Ink Formulation (Percent) | | |
|---|---|---|---|
| Glass Frit A | 64.6 | — | — |
| Glass Frit B | — | 65.1 | — |
| Glass Frit C | — | — | 64.6 |
| Aluminum Oxide | 11.5 | 11.6 | 11.6 |
| Co3O4 (colorant) | 0.8 | 0.8 | — |
| Organic Vehicle | 23.1 | 22.5 | 23.8 |

These ink ingredients were prepared by comminuting the thin ribbons of glass formulations A, B and C in a ball-mill to achieve a mean particle size of about 5 micrometers. The glass formulations were individually combined with a ceramic filler of aluminum oxide having an average particle size of about 3 micrometers. The organic vehicle for the dielectric ink comprised 87 percent of a 10 percent solution of polyisobutyl methacrylate in terpineol, 6.5 percent of terpineol and 6.5 percent of Armeen O.

The ink ingredients were intially hand-mixed, then mixed on a three-roll mill to obtain a smooth paste. Additional solvent was added as required to assure proper rheology. The inks were individually printed on to alumina foil and air-dried at 125° for about 15 minutes. Then, the ink coated alumina substrate was fired in nitrogen at about 900° for 10 minutes to produce a dense film.

EXAMPLE 3

Copper via-fill inks were prepared using devitrifying glass frit A of EXAMPLE 1. An additional copper via-fill ink was prepared using a devitrifying zinc-magnesium-barium-aluminum-zirconium-phosphosilicate glass frit disclosed in commonly assigned U.S. patent application Ser. No. 914,302, entitled "DIELECTRIC INKS FOR MULTILAYER COPPER CIRCUITS", filed Oct. 2, 1986, to K. W. Hang et al. This devitrifying glass frit, hereafter referred to as a glass frit Y, had the following formulation:

| Constituent | Glass Formulation Y (Percent) |
|---|---|
| Zinc Oxide | 21.81 |
| Magnesium Oxide | 19.25 |
| Barium Oxide | 5.88 |
| Silicon Dioxide | 39.68 |
| Aluminum Oxide | 9.38 |
| Phosphorus Pentoxide | 2.00 |
| Zirconium Silicate | 2.00 |

Devitrifying glass frits A and Y differ significantly in the levels of MgO and Al$_2$O$_3$. The copper powder and the devitrifying glass frits for all the via-fill inks had an average particle size of about 3 micrometers.

The via-fill inks were prepared by combining 82.1 percent of solids, i.e., the copper powder and the devitrifying glass frit, with 17.9 percent of an organic vehicle. The organic vehicle comprised: 59.7 percent of a mixture of 6 parts ethyl cellulose and 100 parts Texanol; 15.3 percent of a mixture of 10 parts Thixatiol and 100 parts Texanol; 23.0 percent of Texanol, 0.5 percent of Duomeen TDO as a surfactant; and 0.5 percent of Troysol 98C as a surfactant. The via-fill ink were initially hand mixed and then mixed on a three-roll mill to obtain a paste suitable for screen printing. Additional organic vehicle was added as necessary to ensure proper rheology.

A dielectric ink disclosed in commonly assigned U.S. patent application Ser. No. 087,548 entitled "DIELECTRIC INKS FOR MULTILAYER COPPER CIRCUITS" filed of even date herewith to K. W. Hang et al. was prepared. This dielectric layer contained a devitrifying zinc-magnesium-barium-aluminum-silicate glass frit, hereafter referred to as glass frit Z, which had the following formulation:

| Constituent | Glass Formulation Z (Percent) |
|---|---|
| Zinc Oxide | 22.72 |
| Magnesium Oxide | 20.05 |
| Barium Oxide | 6.13 |
| Aluminum Oxide | 9.76 |
| Silicon Dioxide | 41.34 |

The dielectric ink comprised: 71.68 percent of glass frit Z; 1.16 percent of barium dimagnesium disilicate (filler); 4.46 percent of alumina (filler); 0.19 percent of Cr$_2$O$_3$ (coloring agents; 15.5 percent of 6 parts ethyl cellulose in 100 parts Texanol; 0.97 percent of 10 parts Thixatrol in 100 parts Texanol; 5.81 percent Texanol; and 0.23 percent of Duomeen TD0 (surfactant). The dielectric ink was mixed using the same techniques described for the via-fill ink.

Multilayer test structures were prepared utilizing a conventional alumina substrate and the via-fill materials shown in the Table below. A layer of the dielectric ink described above containing glass frit was printed in a patterned configuration on the alumina substrate such that vias of about 0.5 cm.×0.5 cm. square were formed. The dielectric layer had a thickness of about 20 micrometers. The dielectric layer was dried in air at 115° for 15 minutes and fired in nitrogen at 900° for 10 minutes. Then, the via-fill ink was applied to the test structure to fill the vias left in the dielectric layer. The via-fill layer also had a thickness of about 20 micrometers and was fired using the conditions described for the dielectric layer. A second dielectric layer having the same configuration as the first layer was applied and fired. Then, the vias were filled with the via-fill ink and the structure was fired again. This procedure was repeated with the portion of the dielectric layer adjacent the via inspected for crack under a 10x-20x microscope after the formation of each dielectric/via-fill layer. The following table shows the number of dielectric/via-fill layers which were formed before cracking was observed in the dielectric material around the via.

TABLE

| VIA-FILL INK | SOLIDS COMPOSITION OF VIA-FILL LAYER | | | NO. OF DIELECTRIC/VIA-FILL LAYERS BEFORE CRACKING |
| --- | --- | --- | --- | --- |
| | Cu | Frit A | Frit Y | |
| 1 | 66.7 | — | 33.3 | 5 |
| 2 | 66.7 | 33.3 | — | 14 |
| 3 | 63.3 | 36.7 | — | >20 |

The Table illustrates that the devitrifying glass frit A of the present invention is a superior frit for use in a via-fill in Thus, when the devitrifying glass frits of the present invention are used in the via, multilayer structures with a higher degree of integration can be produced because of the increased number of layers which may be employed without cracking in the dielectric layer around the vias.

We claim:

1. A devitrifying glass frit comprising, on a weight basis:
   from about 19 to about 25 percent of zinc oxide;
   from about 5 to about 20 percent of barium oxide;
   from about 10 to about 30 percent of aluminum oxide;
   from about 30 to about 50 percent of silicon dioxide;
   from about 1 to about 6 percent of magnesium oxide, calcium oxide or mixtures thereof;
   from about 0.5 to about 3 percent of phosphorus pentoxide; and
   from about 1 to about 6 percent of zirconium silicate.

2. A devitrifying glass frit in accordance with claim 1 consisting essentially of, on a weight basis:
   from about 21 to about 23 percent of zinc oxide;
   from about 7 to about 15 percent of barium oxide;
   from about 13 to about 22 percent of aluminum oxide;
   from about 35 to about 45 percent of silicon dioxide;
   from about 2 to about 4.5 percent of magnesium oxide, calcium oxide or mixtures thereof;
   from about 0.5 to about 1.5 percent of phosphorus pentoxide; and
   from about 2 to about 5 percent of zirconium silicate.

3. A devitrifying glass frit in accordance with claim 1 consisting essentially of, on a weight basis:
   from about 21 to about 23 percent of zinc oxide;
   from about 7 to about 15 percent of barium oxide;
   from about 13 to about 22 percent of aluminum oxide;
   from about 35 to about 45 percent of silicon dioxide;
   from about 2 to about 4.5 percent of magnesium oxide;
   from about 0.5 to about 1.5 percent of phosphorus pentoxide; and
   from about 2 to about 5 percent of zirconium silicate.

4. A fused body consisting essentially of, on a weight basis:
   (a) from about 65 to about 100 percent, devitrifying glass frit cosisting essentially of, on a weight basis:
   from about 19 to about 25 percent zinc oxide;
   from about 5 to about 20 percent barium oxide;
   from about 10 to about 30 percent aluminum oxide;
   from about 30 to about 50 percent silicon dioxide;
   from about 1 to about 6 percent of magnesium oxide, calcium oxide or mixtures thereof;
   from about 0.5 to about 3 percent of phosphorus pentoxide;
   from about 1 to about 6 zirconium silicate; and
   (b) up to about 35 percent of a suitable ceramic filler.

5. A fused body in accordance with claim 4 wherein said devitrifying glass frit consisting essentially of, on a weight basis:
   from about 21 to about 23 percent of zinc oxide;
   from about 7 to about 15 percent of barium oxide;
   from about 13 to about 22 percent of aluminum oxide;
   from about 35 to about 45 percent of silicon dioxide;
   from about 2 to about 4.5 percent of magnesium oxide, calcium oxide or mixtures thereof;
   from about 0.5 to about 1.5 percent of phosphorus pentoxide; and
   from about 2 to about 5 percent of zirconium silicate.

6. A fused body in accordance with claim 4 wherein said devitrifying glass frit consisting essentially of, on a weight basis:
   from about 21 to about 23 percent of zinc oxide;
   from about 7 to about 15 percent of barium oxide;
   from about 13 to about 22 percent of aluminum oxide;
   from about 35 to about 45 percent of silicon dioxide;
   from about 2 to about 4.5 percent of magnesium oxide;
   from about 0.5 to about 1.5 percent of phosphorus pentoxide; and
   from about 2 to about 5 percent of zirconium silicate.

7. A fused body in accordance with claim 4 consisting essentially of, on a weight basis, from about 85 to about 95 percent of said devitrifying glass frit and from about 5 to about 15 percent of said filler.

8. A fused body in accordance with claim 7 wherein said filler is selected from the group consisting of diamond powder, aluminum nitride, silicon carbide and mixtures thereof.

* * * * *